(12) United States Patent
Ogirko

(10) Patent No.: US 12,298,355 B2
(45) Date of Patent: May 13, 2025

(54) VOLTAGE MEASUREMENT CHANNEL CALIBRATION FOR BATTERY MANAGEMENT SYSTEMS

(71) Applicant: Cypress Semiconductor Corporation, San Jose, CA (US)

(72) Inventor: Roman Ogirko, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 143 days.

(21) Appl. No.: 18/178,426

(22) Filed: Mar. 3, 2023

(65) Prior Publication Data
US 2024/0295612 A1    Sep. 5, 2024

(51) Int. Cl.
G01R 31/396    (2019.01)
G01R 31/3835    (2019.01)
G01R 35/00    (2006.01)

(52) U.S. Cl.
CPC ....... *G01R 31/396* (2019.01); *G01R 31/3835* (2019.01); *G01R 35/005* (2013.01)

(58) Field of Classification Search
None
See application file for complete search history.

(56) References Cited

U.S. PATENT DOCUMENTS

2018/0284196 A1\* 10/2018 Tomonaga .......... H01M 10/482

\* cited by examiner

*Primary Examiner* — Jas A Sanghera

(57) ABSTRACT

A first step of a calibration procedure is be performed to obtain a first set of voltage measurements by causing each mode switch of a first set of mode switches of a voltage management subsystem to be placed in a first position and each mode switch of a second set of mode switches of the voltage management subsystem to be placed in a second position. Each mode switch is included within a channel of the voltage management subsystem. A second step of the calibration procedure is performed to obtain a second set of voltage measurements by causing each mode switch of the first set of mode switches to be placed in the second position and each mode switch of the second set of mode switches to be placed in the first position.

20 Claims, 8 Drawing Sheets

VOLTAGE MEASUREMENT CHANNEL CALIBRATION FOR BATTERY MANAGEMENT SYSTEMS

TECHNICAL FIELD

This disclosure relates to battery management systems, and more particularly to voltage measurement channel calibration for battery management systems.

BACKGROUND

An electric battery ("battery") is a source of electric power that can power electric devices by converting chemical energy to electrical energy. More specifically, a battery can include a set of voltaic cells ("cells"). A battery can be a rechargeable battery or a non-rechargeable battery. One example of a rechargeable battery is a lithium-ion battery. A lithium-ion battery is a rechargeable battery in which lithium ions move from the negative electrode to the positive electrode during discharging, and the opposite during charging. One example of a lithium-ion battery is a lithium iron phosphate (LiFePO$_4$) battery.

A battery management system can perform rechargeable battery management to improve efficiency, reliability, lifespan, etc. of a battery (e.g., rechargeable battery). For example, a battery management system can be integrated within an electric vehicle (EV) to manage a battery that powers the EV. A battery management system can include a voltage measurement subsystem for measuring voltage of each cell in a battery pack.

The voltage measured by the voltage measurement subsystem can be used to derive one or more battery state parameters. One example of a battery state parameter is state of charge (SoC). SoC generally represents the available capacity of a cell at a particular time. One of the goals for battery management is to balance the SoC of cells to achieve the same voltage for all cells. This balancing can be done passively by discharging elements whose voltage is higher than the minimum voltage in the stack if a passive balancing method is used, or equalizing the voltage by transferring charge from the higher voltage element to the lower voltage element if an active balancing method is used.

BRIEF DESCRIPTION OF THE DRAWINGS

The disclosure is illustrated by way of example, and not of limitation, in the figures of the accompanying drawings.

DETAILED DESCRIPTION

Figure 1A:
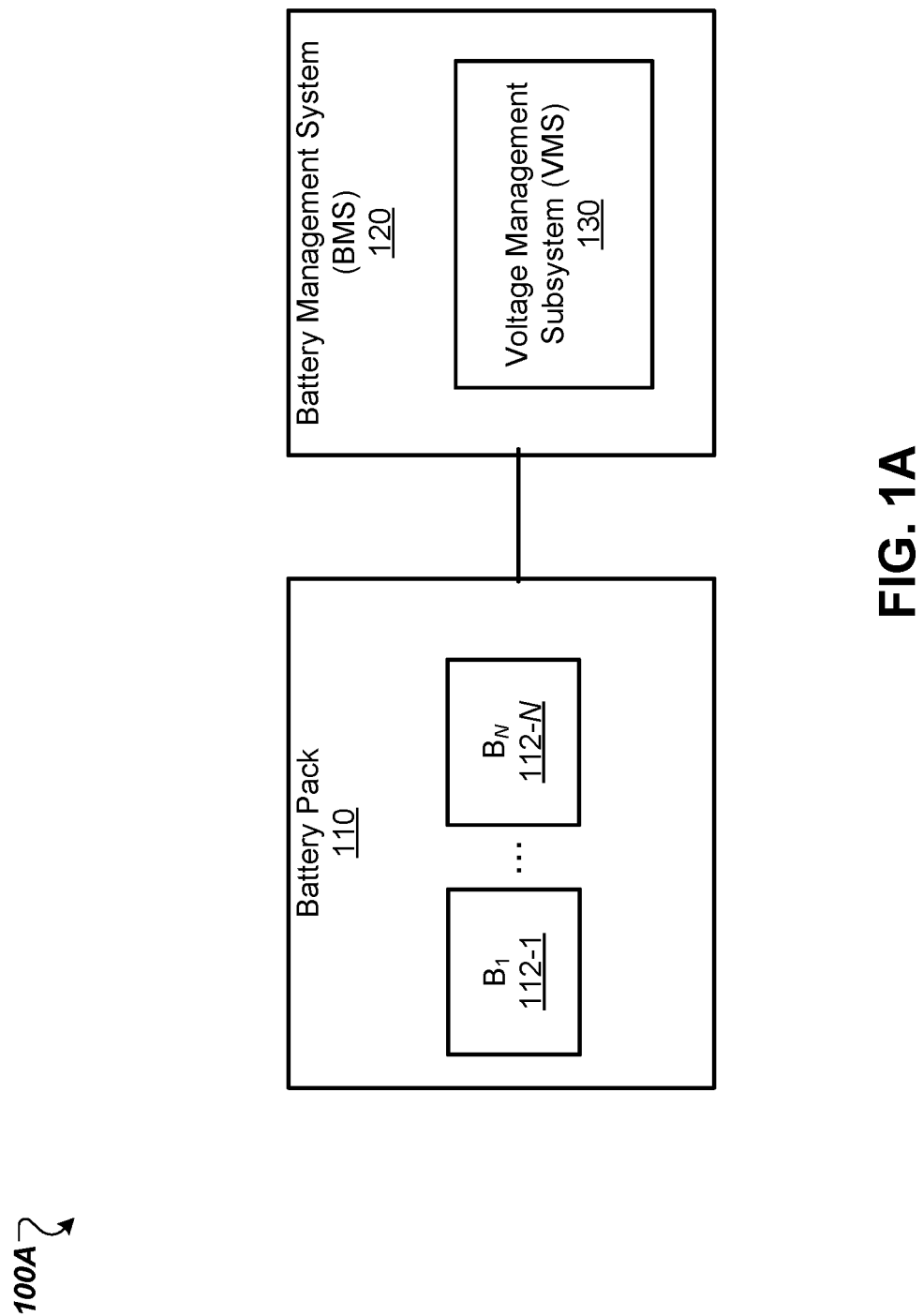
FIG. 1A is a block diagram of an overview of a system including a battery management system, according to some embodiments.

The SoC of a cell of a battery can have a relationship to the open-circuit voltage (OCV) of the cell (i.e., OCV-SoC), and the SoC can be determined from OCV. The OCV of a cell can be defined as the potential difference between electrodes of the cell at equilibrium during a period of zero current flow. The OCV-SoC of some batteries, such as LiFePO$_4$ batteries, can be close to flat for between about 10% to about 90% of the SoC of these batteries. Thus, a battery management system (BMS) may need to implement a highly accurate voltage measurement subsystem to perform effective battery management. The need in some cases for high voltage measurement accuracy can introduce challenges and can lead to increases in the size of the battery management systems.

For example, a BMS can include a multi-channel voltage measurement subsystem, in which each voltage measurement channel ("channel") of the voltage measurement subsystem can operate at a different common-mode voltage to measure voltage of a respective cell of a battery pack. To improve voltage measurement accuracy, voltage measurement calibration ("calibration") can be performed with respect to each channel. Channel calibration, which can cover all components of the channel, can reduce the requirements for the accuracy of the components of the channel and makes the system accuracy determined by the accuracy of the reference voltage source.

In some implementations, voltage measurement can be used to calculate SoC during the battery loading using measurements of the loading current by calculating the consumed energy as $$W = \sum_n V[n] \cdot I[n] \cdot \Delta ts \qquad (1)$$

where V[n] is a voltage sample, I[n] is a current sample, $\Delta$ts is a sampling period, and n is sample number. For these purposes, the voltage and current samples must be synchronous and consequently, separate channels are usually used to measure each voltage and current, which perform measurements simultaneously and synchronously. There may be several voltage measurement subsystem options for measuring the voltage of the cells in the battery pack using a sampling capacitor.

In a first voltage measurement subsystem option ("first option"), the voltage measurement subsystem can use parallel sampling to measure the voltage of serially connected cells. More specifically, the sampling capacitor can be configured to connect to the cell and/or to a charge-to-code converter ("converter") in parallel. For example, the converter can be based on a $\Sigma\Delta$ modulator. Each channel can be periodically connected, at a frequency (Fmod), in parallel to the cell using a first pair of switches or to the converter using a second pair of switches. The sampling capacitor of each channel can collect charge $Qx_k$ in accordance with the following equation:

$$Qx_k = C_k \cdot \text{Vcell}_k \qquad (2)$$

where k is an index number of the channel, $Cs_k$ is the capacitance of the sampling capacitor of the k-th channel, and $\text{Vcell}_k$ is the voltage of the cell connected to the k-th channel. This charge can be converted into code, by a converter of the k-th channel with conversion ratio $G_k$. For example, $G_k = G + \Delta_k$, where G is a charge-to-code conversion ("conversion") factor (e.g., rated value of the conversion factor) and $\Delta_k$ is an error of the conversion factor for the k-th channel. The voltage measurement obtained by the k-th channel for the corresponding cell, $Nx_k$, can be determined as follows:

$$Nx_k = Cs_k \cdot \text{Vcell}_k \cdot G_k \qquad (3)$$

The error of the voltage measurement depends on the accuracy of trimming the values of the sampling capacitor and the conversion factor. Achieving the required accuracy over the lifetime is a real challenge. Implementing channel calibration can reduce the problem of accuracy to the stability of the reference. If it is possible to apply a reference voltage measurement of a known value to a channel input, then the reference voltage measurement can be used to correct the error caused by inaccurate values of the sampling capacitor and conversion factor. The reference voltage measurement of cell k, $\text{Nref}_k$, can be determined as follows:

$$\text{Nref}_k = Cs_k \cdot \text{Vref} \cdot G_k \qquad (4)$$

where Vref is the reference voltage of a reference voltage source. A more accurate real value of the reference voltage measurement, #Vref, can be determined by adjusting Vref based on some value, $\Delta\text{instr}$, determined by an instrument at the manufacturing stage and stored in the device memory (e.g., #Vref=Vref+$\Delta\text{instr}$). Thus, a more accurate voltage measurement value of cell k, #$\text{Vcell}_k$, can be determined as:

$$\#\text{Vcell}_k = \frac{Nx_k}{\text{Nref}_k} \cdot \#\text{Vref} \qquad (5)$$

Combining equations (3)-(5), #$\text{Vcell}_k$ can be determined based on the voltage of the cell, the reference voltage as a follows:

$$\#\text{Vcell}_k = \frac{Cs_k \cdot \text{Vcell}_k \cdot G_k}{Cs_k \cdot \text{Vref} \cdot G_k} \cdot (\text{Vref} + \Delta\text{instr}) = \cdot \text{Vcell}_k \cdot \left(1 + \frac{\Delta\text{instr}}{\text{Vref}}\right) \qquad (6)$$

In view of the above, the cell voltage measurement error is proportional to the measurement accuracy of a reference voltage value.

To implement the calibration scheme described above, in some examples, a channel of a voltage measurement subsystem can further include a pair of reference voltage switches that can open/close a connection to the reference voltage source. Control signals, including a measure control signal and a calibration control signal can be used to control the channel switches to enable a voltage measurement mode to measure cell voltage or a calibration mode to calibrate the channel.

To enable the voltage measurement mode, the control signals can be set to a voltage measurement setting, which can cause the first and second pairs of switches described above to connect the sampling capacitor to the cell voltage and the converter. For example, the measure control signal can be set to 1 and the calibration control signal can be set to 0. To enable the calibration mode the control signals can be set to a calibration setting, which can cause the reference voltage switches to connect the sampling capacitor to the reference voltage source and the converter. For example, the measure signal can be set to 0 and the reference signal can be set to 1. However, high-voltage switches can be used to implement the voltage measurement subsystem in accordance with the first option described above. The use of high voltage switches can significantly increase wafer footprint (e.g., silicon footprint) and cost.

In a second voltage measurement subsystem option ("second option"), the voltage measurement subsystem can use serial sampling to measure the voltage of serially connected cells. More specifically, the sampling capacitor described above can be connected serially to a single-end input of the converter by one of its terminals. The other terminal can be switched between the terminals of the cell at a frequency Fmod. For each channel, switching from the negative terminal to the positive terminal of the corresponding cell can generate a charge to the converter input equal to:

$$Qx_k \mathrel{+}= Cs_k \cdot \text{Vcell}_k \qquad (7)$$

and switching from the positive terminal to the negative terminal of the corresponding cell can generate a charge to the converter input equal to:

$$Qx_k \mathrel{-}= -Cs_k \cdot \text{Vcell}_k \qquad (8)$$

The measurement result is formed as the difference of the two conversion outputs. According to equation (4), this result is equal to:

$$Nx_k = [Cs_k \cdot \text{Vcell}_k \cdot G_k] - [-Cs_k \cdot \text{Vcell}_k \cdot G_k] = 2 \cdot Cs_k \cdot \text{Vcell}_k \cdot G_k \qquad (9)$$

A similar effect can be obtained if the channel is a differential channel including a differential converter. For example, a differential channel can be implemented by replacing the single serially connected sampling capacitor described above with a pair of serially connected sampling capacitors. More specifically, a first sampling capacitor of the pair can be connected serially to one input of the converter by one of its terminals and a second sampling capacitor of the pair can be connected to the other input of the converter. In this example, an additional switch is placed between the cell and the pair of sampling capacitors (in addition to the single switch between the cell and the single sampling capacitor described above). In this differential channel example, the sampling capacitor value from equation (4), $Csmp_k$, can be determined based on a first sampling capacitor value of the first sampling capacitor and a second sampling capacitor value of the second sampling capacitor. For example, $Csmp_k$ can be determined as the average of the first and second sampling capacitor values. The transmission factor error in the second option can be calibrated in a similar way as in the first option by connecting each channel to the reference voltage source and calculating the measurement results using equation (5).

The second option can have some advantages over the first option. For example, the second option can use fewer high-voltage switches as compared to the first option (the lower-voltage switches used must tolerate the maximum cell voltage with a margin), which can decrease wafer footprint relative to the first option. Moreover, the charge inversion by switching with subsequent differentiation of the original conversion data can eliminate any effect of offsets on the measurement results. However, although fewer high-voltage switches are used, at least one switch can be a high-voltage switch. For example, in the differential channel example, the additional switch added to enable the differential channel can be a high-voltage switch.

Described herein are various embodiments of techniques for implementing voltage measurement channel ("channel") calibration for battery management systems. A battery management system can be configured to connect to a battery pack including multiple cells to perform battery management. A battery management system described herein can include a voltage measurement subsystem, a processing unit (e.g., microprocessor unit) for operation control and communication with a host, and a supply voltage regulator to provide power to the system components from the voltage of the battery pack being serviced. Examples of devices that may use a battery management system including a voltage management subsystem in accordance with embodiments described herein include, without limitation, automobiles, home appliances (e.g., refrigerators, washing machines, etc.), personal computers (e.g., laptop computers, notebook computers, etc.), mobile computing devices (e.g., tablets, tablet computers, e-reader devices, etc.), mobile communication devices (e.g., smartphones, cell phones, personal digital assistants, messaging devices, pocket PCs, etc.), connectivity and charging devices (e.g., hubs, docking stations, adapters, chargers, etc.), audio/video/data recording and/or playback devices (e.g., cameras, voice recorders, hand-held scanners, monitors, etc.), body-wearable devices, and other similar electronic devices.

The voltage measurement subsystem can include multiple channels each connected to a respective cell of the battery pack, a reference source, and a reference voltage switch. Each channel and cell can be defined by a respective index number. For example, if there are N channels and N cells, then a first channel can have an index number of 1 (i.e., $Ch_1$), a second channel can have an index number of 2 (i.e., $Ch_2$), . . . , and an N-th channel can have an index number of N (i.e., $Ch_N$). Similarly, a first cell can have an index number of 1 (i.e., $B_1$), a second cell can have an index number of 2 (i.e., $B_2$), . . . , and an N-th cell can have an index number of N (i.e., $B_N$)

Each channel can include at least one sampling switch, at least one mode switch, at least one sampling capacitor, and a converter. For each channel, the at least one sampling switch is located between the cell corresponding to the channel and the at least one mode switch, the at least one mode switch is located between the at least one sampling switch and the at least one sampling capacitor, and the at least one sampling capacitor is located between the at least one mode switch and the converter.

In some embodiments, each sampling switch and each mode switch is a single pole double throw (SPDT) switch to enable the sampling switch and the mode switch to control two different circuits using a single input. More specifically, the at least one sampling switch of a given channel (i.e., $Ch_k$) can selectively connect to one of: a first pad (i.e., "positive" pad) to establish a connection to the positive terminal of the cell corresponding to the given channel, or a second pad (i.e., "negative" pad) to establish a connection to the negative terminal of the cell corresponding to the given channel. The at least one mode switch of the given channel can selectively connect to one of: the at least one sampling switch of the channel, or another switch. For example, if the given channel is adjacent to a channel having a lower index number (i.e., $Ch_{k-1}$), then the other switch can be the sampling switch of the adjacent channel having the lower index number than the given channel. If the given channel is not adjacent to a channel having a lower index number (i.e., if the given channel is $Ch_1$), then the other switch can be the reference voltage switch. Each sampling switch can be designed to tolerate the voltage of a single cell, and each mode switch can be designed to tolerate the voltage of two cells (i.e., approximately double the voltage of the sampling switch). Accordingly, a given channel and an adjacent channel can measure the same cell voltage.

The voltage measurement subsystem can operate in a default mode to report voltage measurements, or a calibration mode to calibrate the channels. The switch position of each mode switch can be controlled by a mode control signal. In the default mode, for each channel, the mode control signal causes the switch position of the mode switch to be connected to the sampling switch of the channel. The sampling switches operate at frequency Fmod and each channel can report voltage measurements, such as according to equation (3) or equation (9) described above.

Embodiments described herein can implement a calibration mode with a two-step channel calibration procedure ("calibration procedure"). During a first step of the calibration procedure, mode switches of channels having an odd index number (i.e., odd channels) can be switched to a first position and mode switches of channels having an even index number (i.e., even channels) can be switched to a second position opposite the first position. In some embodiments, the first position is an up position and the second position is a down position. For example, the up position can refer to a position in which a mode switch of a channel is connected to a sampling switch of the channel, and the down position can refer to a position in which a mode switch of a first channel is connected to one of: a sampling switch of a second channel adjacent to the first channel, or a reference voltage switch connected to a reference voltage source. For example, during the first step of the calibration procedure, a first channel and a second channel adjacent to the first channel can measure the voltage of a cell corresponding to the given channel to generate a first voltage measurement.

During a second step of the calibration procedure, the mode switches of the odd channels can be switched to the second position (e.g., up position) and the mode switches of the odd channels can be switched to the first position (e.g., the down position). For example, during the second step of the calibration procedure, the second channel and a third channel adjacent to the second channel can measure the voltage of the cell corresponding to the second channel to generate a second voltage measurement.

The first voltage measurement and the second voltage measurement obtained during the calibration procedure can be used to compensate for channel error in real operation conditions. For example, the first voltage measurement and the second voltage measurement can be used to compensate for transfer factor error of each channel including sampling capacitor variation.

The two-step channel calibration procedure described herein can obviate the need for high-voltage switches. For example, the voltage measurement subsystem architecture can be designed without using any high-voltage switches. Moreover, the two-step channel calibration procedure can reduce the impact on the measurement result of the change in the value of the sampling capacitor caused by different capacitor voltages. The accuracy of the calibration procedure can be limited by the error of the reference voltage value determination, the reference voltage stability in time and temperature, the converter noise (which can be ignored if the noise value is sufficiently low relative to a target accuracy). The sampling capacitor value including variation caused by a common-mode high-voltage offset can be addressed by the calibration procedure. The sampling capacitor voltage can vary in value of one cell voltage during calibration, causing small differences of operation conditions between the default mode and the calibration operation mode.

Reference in the description to "an embodiment," "some embodiments," "an example embodiment," "some embodiments," and "various embodiments" means that a particular feature, structure, step, operation, or characteristic described in connection with the embodiment(s) is included in at least some embodiments of the invention. Further, the appearances of the phrases "an embodiment," "some embodiments," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The following description sets forth numerous specific details such as examples of specific systems, components, methods, and so forth, in order to provide a good understanding of various embodiments of the techniques described herein for implementing voltage measurement calibration for battery management systems. It will be apparent to one skilled in the art, however, that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present invention.

FIG. 1A is a block diagram of a system 100A, according to some embodiments. The system 100A includes a battery pack 110 operatively coupled to a battery management system (BMS) 120. As shown the battery pack 110 can include a set of cells $B_1$ 112-1 through $B_N$ 112-N. The battery pack 110 can include any suitable number of cells. For example, the battery pack 110 can include at least 18 cells (e.g., N=18). However, such examples should not be considered limiting.

The BMS 120 can further include a voltage measurement subsystem (VMS) 130. As will be described in further detail below with reference to FIG. 1B, the VMS 130 includes a set of channels, in which each channel of the set of channels is operatively coupled to a pair of terminals of a respective cell of the set of cells 112-1 through 112-N. As will be described in further detail below with reference to FIGS. 2A-4, the VMS 130 in various embodiments can implement a two-step channel calibration procedure to calibrate each channel of the set of channels, which can be enabled without the use of high-voltage switches.

Figure 1B:
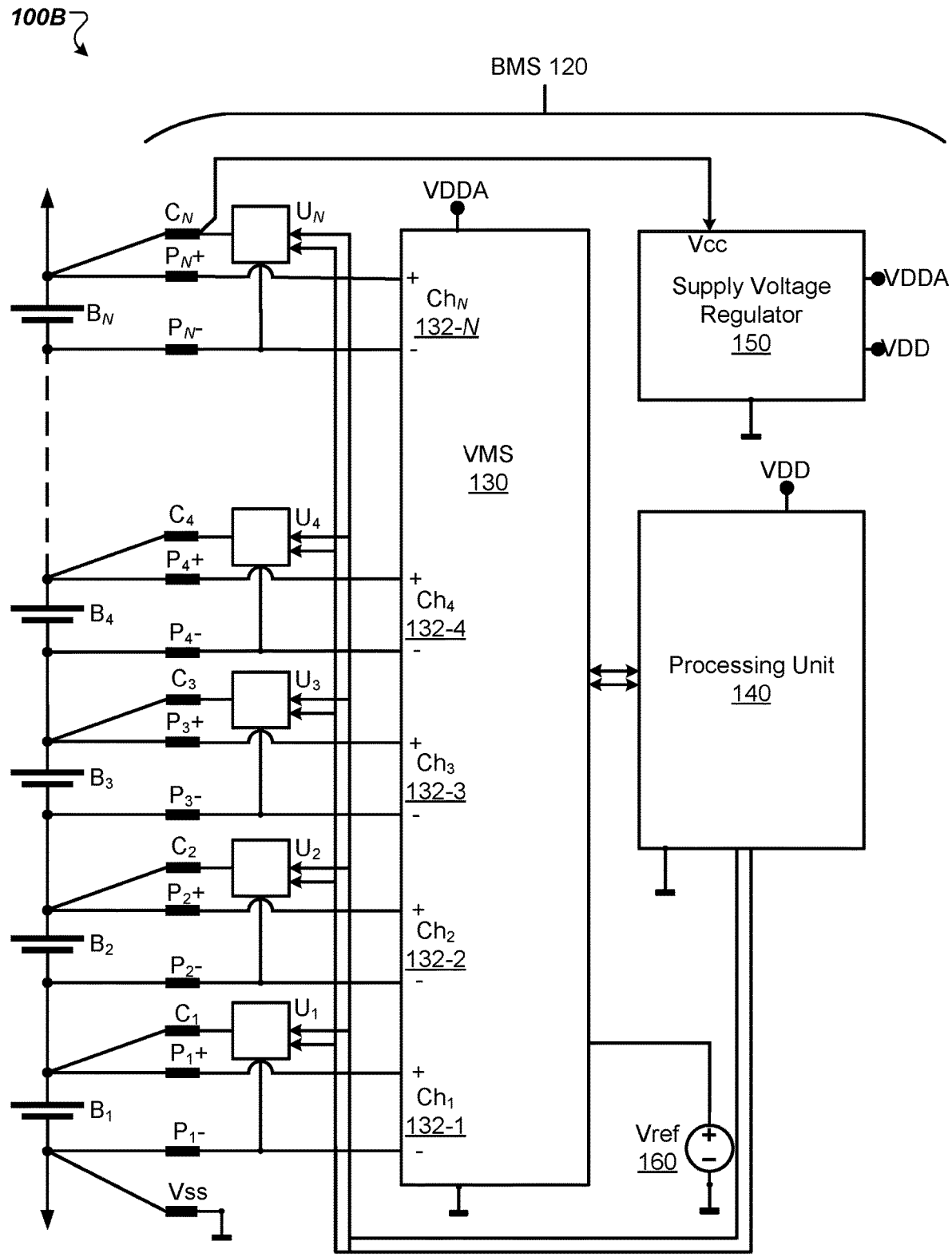
FIG. 1B is a schematic diagram of an example system including a battery management system, according to some embodiments.

FIG. 1B is a schematic diagram of a system 100B, according to some embodiments. The system 100B includes the set of cells $B_1$ through $B_N$ (i.e., the set of cells 112-1 through 112-N of FIG. 1A). The system 100B further includes the BMS 120 including the VMS 130. The VMS 130 can include a set of channels $Ch_1$ 132-1 through $Ch_N$ 132-N. Each channel of the set of channels $Ch_1$ 132-1 through $Ch_N$ 132-N is operatively coupled to a pair of terminals of a respective cell of the set of cells $B_1$ through $B_N$. More specifically, each channel of the set of channels $Ch_1$ 132-1 through $Ch_N$ 132-N. $Ch_k$, can be connected to a respective pair of pads $P_k^+$ and $P_k^-$, where k∈[1, N]. More specifically, $P_k^+$ is a positive pad connected to a positive terminal of a corresponding cell $B_k$ and $P_k^-$ is a negative pad connected to a negative terminal of the corresponding cell $B_k$. The BMS 120 can further include a set of capacitors $C_1$ through $C_N$. More specifically, a positive pad of each cell of the set of cells $B_1$ through $B_N$ can be connected to a respective capacitor of the set of capacitors $C_1$ through $C_N$.

The BMS 120 further includes a processing unit 140 operatively coupled to the VMS 130 for operation control and communication with a host. In some embodiments, the processing unit is a microprocessor unit (MPU). The BMS 120 can further include a set of battery cell load blocks $U_1$ through $U_N$ which can be used to reduce the voltage of some cells of the set of cells $B_1$ through $B_N$ to equalize cell voltages. More specifically, each battery cell load block $U_1$ through $U_N$ can be operatively coupled to the processing unit 140.

The BMS 120 can further include a supply voltage regulator 150 to provide power to components of the BMS 120 from the voltage of the battery pack including the set of cells (i.e., battery pack 110 of FIG. 1A). More specifically, the supply voltage regulator 150 can be operatively coupled to capacitor $C_N$.

The BMS 120 further includes a reference voltage source (Vref) 160 operatively coupled to the VMS 130. Vref 160 can generate a reference voltage that can be used by the VMS 130 during calibration, as will be described in further detail below.

In some embodiments, and as will be described in further detail below with reference to FIG. 2A, the VMS 130 can be a single-end channel VMS. More specifically, each channel of the set of channels $Ch_1$ 132-1 through $Ch_N$ 132-N can be a single-end channel including a single sampling switch and a single mode switch. The sampling switch of channel $Ch_k$ can selectively connect to one of $P_i^+$ or $P_i^-$ and the mode switch of channel $Ch_k$ can selectively connect to one of: the output of the sampling switch of channel $Ch_k$, the output of the sampling switch of channel $Ch_{k-1}$ (i.e., the adjacent channel with a lower index value) (i.e., if k>1), or the output of the reference voltage switch Vref 160 (i.e., if k=1).

In some embodiments, and as will be described in further detail below with reference to FIG. 3, the VMS 130 can be a differential channel VMS. More specifically, each channel of the set of channels $Ch_1$ 132-1 through $Ch_N$ 132-N can be a differential channel including a pair of sampling switches and a pair of mode switches. The pair of sampling switches of the channel $Ch_k$ can selectively connect to one of $P_k^+$ or $P_k^-$ and the pair of mode switches of channel $Ch_k$ can selectively connect to one of: the output of the pair of sampling switches of channel $Ch_k$, the output of the pair of sampling switches of channel $Ch_{k-1}$ (i.e., if k>1), or the output of the reference voltage switch Vref 160 (i.e., if k=1).

As will be described in further detail below with reference to FIGS. 2A and 3, the system 100B can operate in a default mode to obtain voltage measurements for one or more cells of the set of cells $B_1$ through $B_N$. As will be described in further detail below with reference to FIGS. 2B-2C, the system 100B can operate in a two-step channel calibration procedure to calibrate each channel of the set of channels $Ch_1$ 132-1 through $Ch_N$ 132-N. The results of the calibration procedure can be used to correct channel gain error associated with a charge-to-code converter ("converter") included within each channel of the set of channels $Ch_1$ 132-1 through $Ch_N$ 132-N.

Figure 2A:
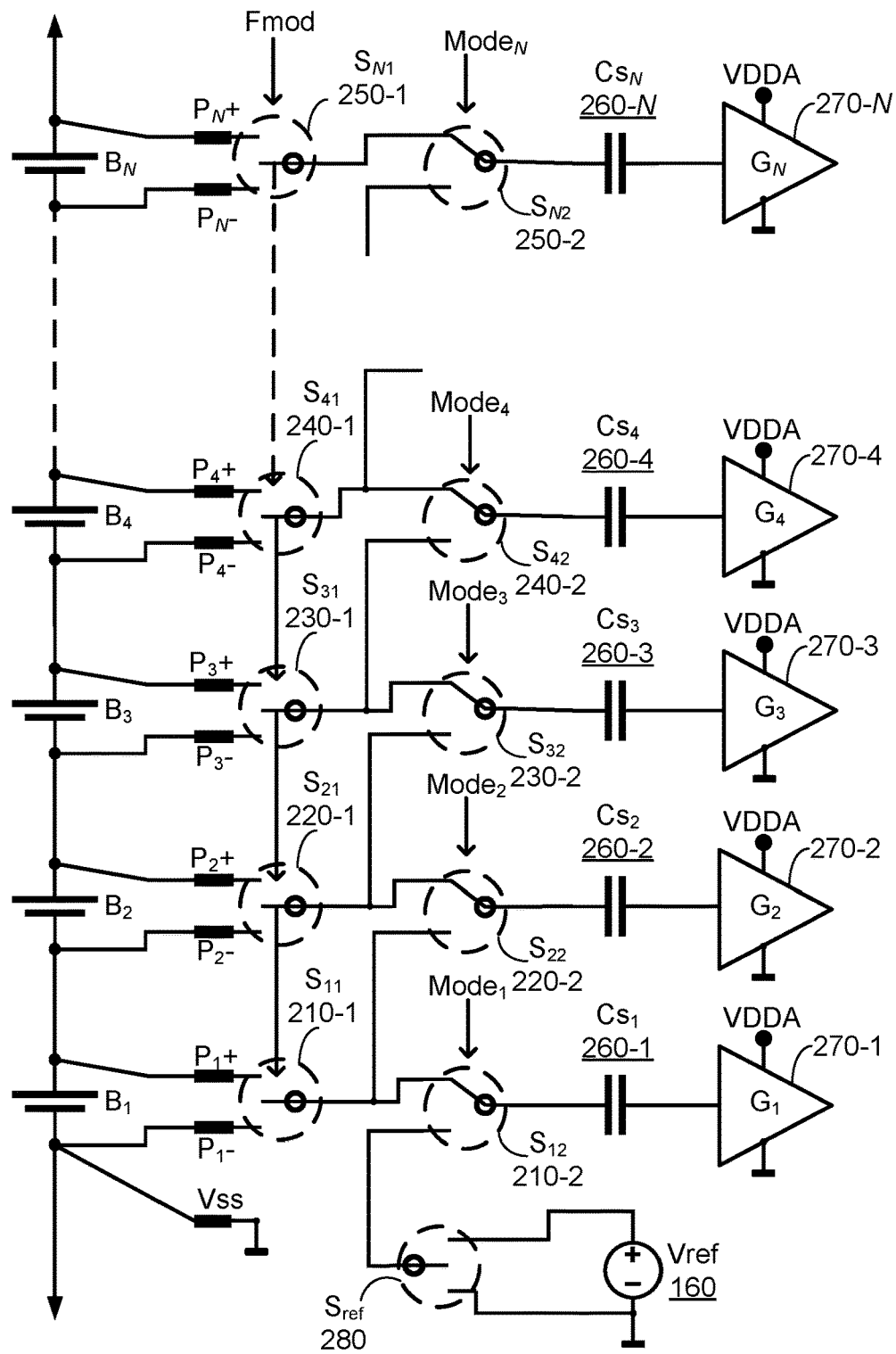
FIG. 2A is a schematic diagram of an example system including a single-end channel voltage management system configured in a default mode, according to some embodiments.

FIG. 2A is a schematic diagram of an example system 200 including a single-end channel VMS, according to some embodiments. The single-channel VMS can be used to implement the VMS 130 of FIGS. 1A-1B. The system 200 includes a set of cells $B_1$ through $B_N$, a set of pairs of pads (e.g., $P_k^+$ and $P_k^-$), a set of channels $Ch_1$ through $Ch_N$, and Vref 160. More specifically, each channel $Ch_k$ of the set of channels $Ch_1$ through $Ch_N$ is a single-end channel including a sampling switch $S_{k1}$ and a mode switch $S_{k2}$. For example, channel $Ch_1$ includes a sampling switch $S_{11}$ 210-1 and a mode switch $S_{12}$ 210-2, channel $Ch_2$ includes a sampling switch $S_{21}$ 220-1 and a mode switch $S_{22}$ 220-2, channel $Ch_3$ includes a sampling switch $S_{31}$ 230-1 and a mode switch $S_{32}$ 230-2, channel $Ch_4$ includes a sampling switch $S_{41}$ 240-1 and a mode switch $S_{42}$ 240-2, . . . , and channel $Ch_N$ includes a sampling switch $S_{N1}$ 250-1 and a mode switch $S_{N2}$ 250-2.

Each channel $Ch_k$ of the set of channels $Ch_1$ through $Ch_N$ further includes a sampling capacitor $Cs_k$. For example, channel $Ch_1$ includes a sampling capacitor $Cs_1$ 260-1, channel $Ch_2$ includes a sampling capacitor $Cs_2$ 260-2, channel $Ch_3$ includes a sampling capacitor $Cs_3$ 260-3, channel $Ch_4$ includes a sampling capacitor $Cs_4$ 260-4, . . . , and channel $Ch_N$ includes a sampling capacitor $Cs_N$ 260-5. Each sampling capacitor $Cs_k$ is connected to an output of the mode switch $S_{k2}$.

Each channel $Ch_k$ of the set of channels $Ch_1$ through $Ch_N$ further includes a charge-to-code converter ("converter"). For example, channel $Ch_1$ includes a converter 270-1, channel $Ch_2$ includes a converter 270-2, channel $Ch_3$ includes a converter 270-3, channel $Ch_4$ includes a converter 270-4, . . . , and channel $Ch_N$ includes a converter 270-5. Each converter 270-1 through 270-5 has a respective conversion ratio $G_1$ through $G_N$. In some embodiments, each converter 270-1 through 270-5 is based on a $\Sigma\Delta$, and the conversion ratio of the k-th channel, $G_k$, $=G+\Delta_k$ where G is a conversion factor (e.g., rated value of the conversion factor) and $\Delta_k$ is an error of the conversion factor for the k-th channel.

The system 200 further includes a reference voltage switch ($S_{ref}$) 280 that can selectively connect to a positive terminal of Vref 160 or a negative terminal of Vref 160. The reference voltage measurement of cell $B_k$, $Nref_k$, can be determined as follows: $C_k \cdot Vref \cdot G_k$, where Vref is the reference voltage output by $V_{ref}$ 160.

Each sampling switch $S_{k1}$ can selectively connect to $P_k^+$ or $P_k^-$. The position of each of the sampling switches 210-1 through 250-1 can be controlled via a frequency signal "Fmod". More specifically, Fmod can periodically cause one or more of the sampling capacitors $Cs_1$ through $CS_N$ 260-1 through 260-N to be connected to one or more of the respective cells $B_1$ through $B_N$ by controlling the position of one or more respective sampling switches 210-1 through 250-1.

Each mode switch $S_{k2}$ can selectively connect to an output of the sampling switch $S_{k1}$, an output of the sampling switch $S_{(k-1)2}$, or an output of $S_{ref}$ 280 (e.g., in the case of mode switch $S_{12}$ 210-2). The position of each of the mode switches 210-2 through 250-2 can be controlled by a respective mode signal (e.g., "Mode$_1$", "Mode$_2$". "Mode$_3$" "Mode$_4$" and "Mode$_5$"). For example, the position of each of the mode switches can reflect operation in a default mode, or a calibration mode.

The system 200 shown in FIG. 2A is configured in a default mode. More specifically, each of the sampling switches 210-1 through 250-1 is in a neutral position. Additionally, each of the mode switches 210-2 through 250-2 is in an up position to connect to an output of respective ones of the sampling switches 210-1 through 250-1. $S_{ref}$ 280 is in a neutral mode.

As will now be described in further detail below with reference to FIGS. 2B-2C, the positions of the mode switches 210-2 through 210-5 can be adjusted to configure the system 200 to be in a first step of a two-step calibration procedure or a second step of the two-step calibration procedure, respectively. More specifically, two measurements are made to get accurate value of the cell voltage. The two-step calibration procedure can be performed periodically and/or after the environmental conditions change.

Figure 2B:
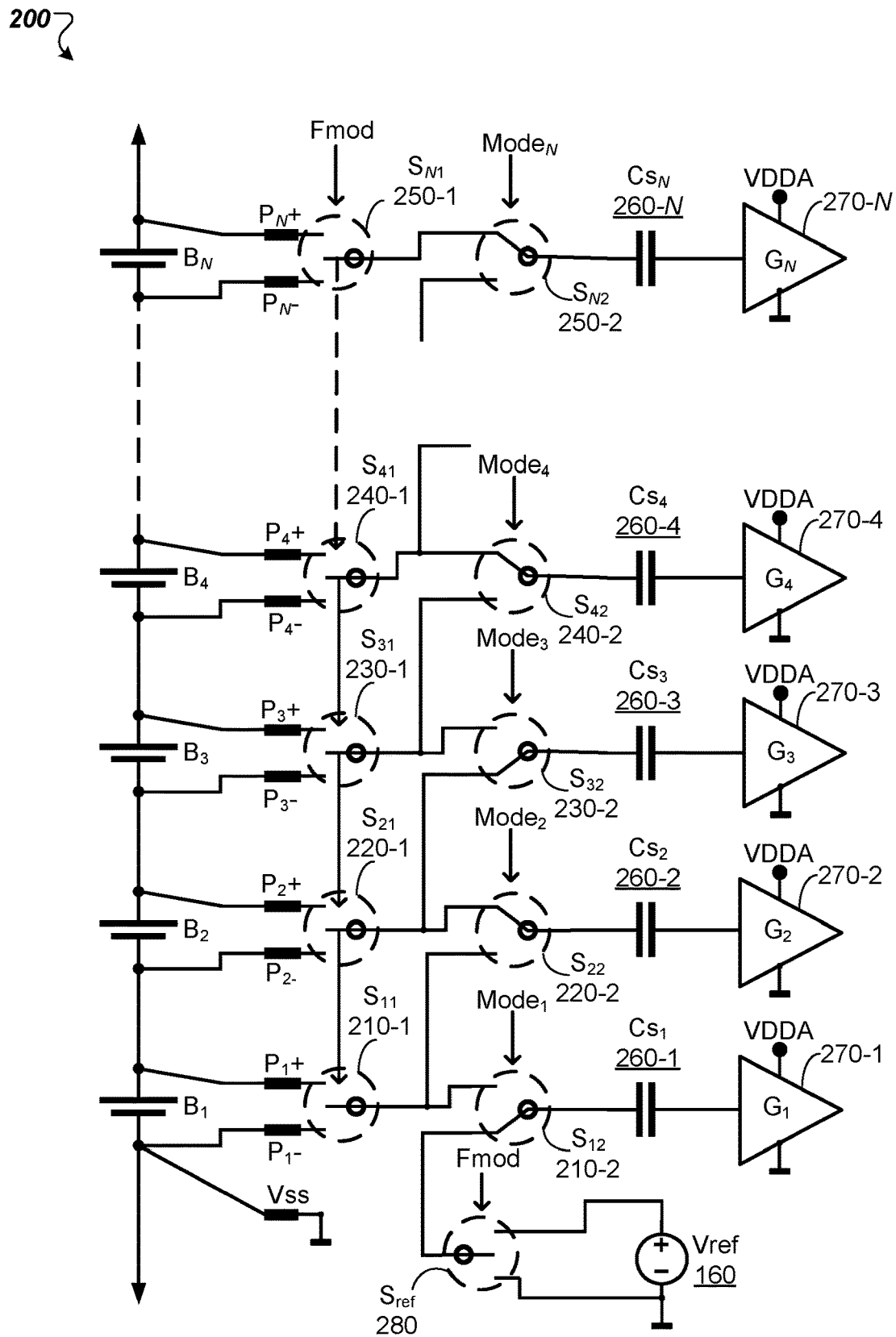
FIG. 2B is a schematic diagram of an example system including a single-end channel voltage management system configured in a first step of a calibration mode, according to some embodiments.

FIG. 2B is a schematic diagram of the example system 200, according to some embodiments. More specifically, the system 200 is configured in a first step of a calibration procedure. In the first step of the calibration procedure, odd mode switches are placed in a down position and even mode switches are placed in an up position. It is assumed in this example that N is an even number. For example, mode switch 210-2 is connected to an output of Sref 280, and mode switch 230-2 is connected to an output of sampling switch 220-1. Moreover, mode switch 220-2 is connected to an output of sampling switch 220-1, mode switch 240-2 is connected to an output of sampling switch 240-1, and mode switch 250-2 is connected to an output of sampling switch 250-1. Accordingly, in the first step of the calibration mode, the mode switch for each odd channel (except for $Ch_1$) is connected to an output of the sampling switch of the adjacent channel having a lower index number, and the mode switch for $Ch_1$ is connected to an output of Sref 280.

During the first step of the calibration procedure, $Ch_1$ measures the reference voltage provided by Vref 160, and pairs of adjacent even and odd channels measure the voltage of respective ones of the even cells (e.g., $Ch_2$ and $Ch_3$ measure the voltage of cell $B_2$, $Ch_4$ and $Ch_5$ measure the voltage of cell $B_4$, $Ch_N$ measures the voltage of cell $B_N$).

Each channel $Ch_k$ can report the following voltage measurement result:

$$NVref_1 \equiv Cs_1 \cdot Vref \cdot G_1 \quad (10)$$

$$NVB_{2,2} \equiv Cs_2 \cdot VB_2 \cdot G_2 \quad (11)$$

$$NVB_{2,3} \equiv Cs_3 \cdot VB_2 \cdot G_3 \quad (12)$$

$$NVB_{4,4} \equiv Cs_4 \cdot VB_4 \cdot G_4 \quad (13)$$

$$\vdots$$

$$NVB_{18} \equiv Cs_{18} \cdot VB_{18} \cdot G_{18} \quad (14)$$

where $VB_k$ is the voltage of cell $B_k$, $NVref_1$ is the result of the conversion of the reference voltage provided by $Ch_1$, and $NVB_{j,k}$ is the conversion result of the voltage of cell $B_j$ provided by $Ch_k$.

Figure 2C:
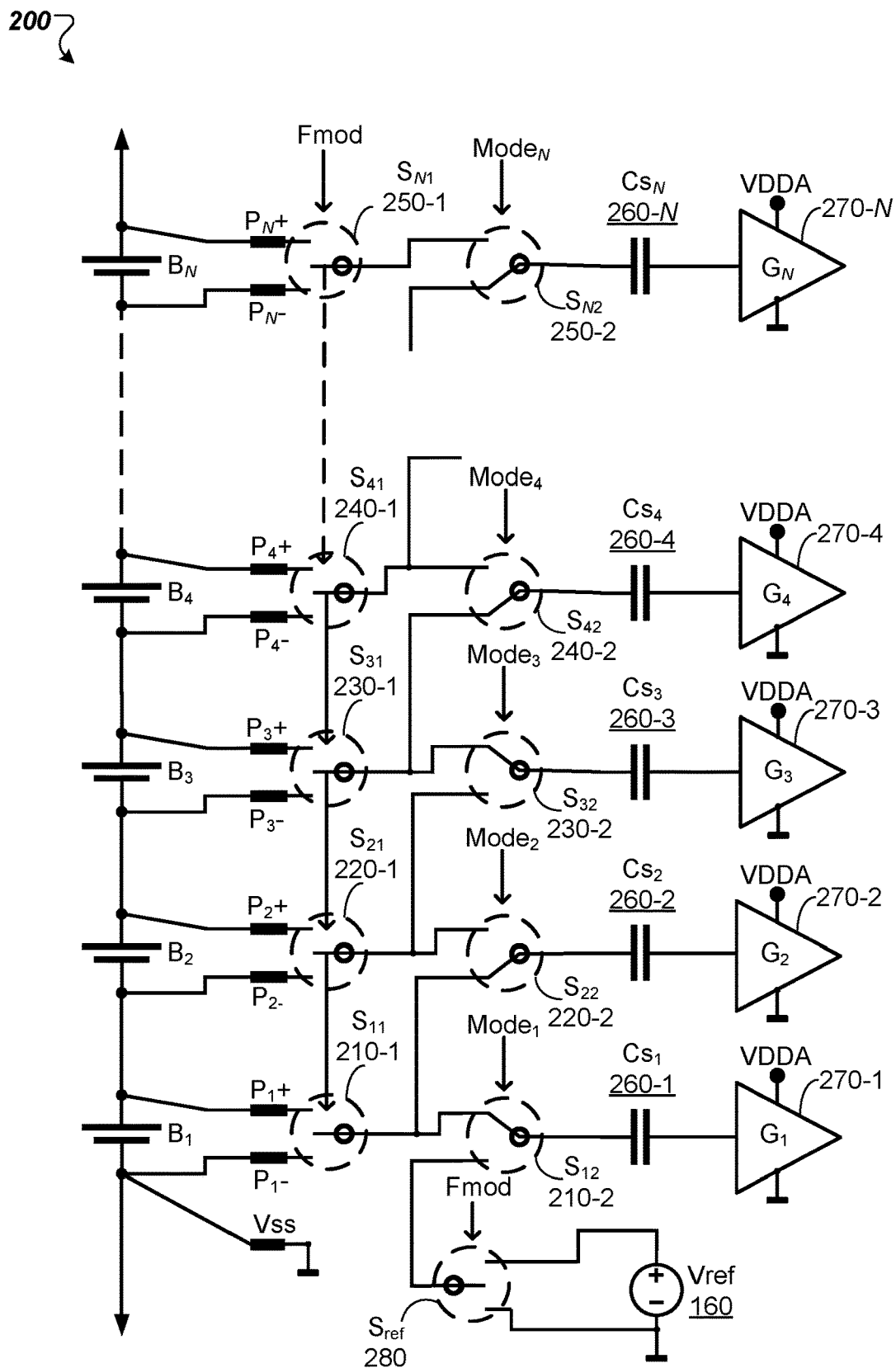
FIG. 2C is a schematic diagram of an example system including a single-end channel voltage management system configured in a second step of a calibration mode, according to some embodiments.

FIG. 2C is a schematic diagram of the example system 200, according to some embodiments. More specifically, the system 200 is configured in a second step of the calibration procedure. In the second step of the calibration procedure, odd mode switches are now placed in an up position and even mode switches are now placed in a down position. It is assumed again in this example that N is an even number. For example, mode switch 210-2 is connected to an output of sampling switch 210-1, and mode switch 230-2 is connected to an output of sampling switch 230-1. Moreover, mode switch 220-2 is connected to an output of sampling switch 210-1, mode switch 240-2 is connected to an output of sampling switch 230-1, and mode switch 250-2 is connected to an output of sampling switch 240-1. Accordingly, in the second step of the calibration mode, the mode switch for each even channel is connected to an output of the sampling switch of the adjacent channel having a lower index number.

During the second step of the calibration procedure, pairs of adjacent odd and even channels measure the voltage of respective ones of the odd cells (e.g., $Ch_1$ and $Ch_2$ measure the voltage of cell $B_1$, $Ch_3$ and $Ch_4$ measure the voltage of cell $B_3$, $Ch_{N-1}$ and $Ch_N$ measure the voltage of cell $B_{N-1}$). Each channel $Ch_k$ can report the following voltage measurement result:

$$NVB_{1,1} \equiv Cs_1 \cdot VB_1 \cdot G_1 \quad (15)$$

$$NVB_{1,2} \equiv Cs_2 \cdot VB_1 \cdot G_2 \quad (16)$$

$$NVB_{3,3} \equiv Cs_3 \cdot VB_1 \cdot G_2 \quad (17)$$

$$NVB_{3,4} \equiv Cs_4 \cdot VB_3 \cdot G_4 \quad (18)$$

$$\vdots$$

$$NVB_{17,18} \equiv Cs_{18} \cdot VB_{17} \cdot G_{18} \quad (19)$$

Since the dynamic properties of the channels are the same, the conversion results provided by the pair of channels that interact with the single cell at the same time reflect the same voltage as described above in FIGS. 2B-2C, even if the voltage of the single cell changes during the conversion. This means that the voltage of the cell indicated by the various channels located in the numerator and denominator of the equation can be reduced.

The results of conversions in the two steps of the calibration procedure can be used to correct gain error of each channel. The error of $Ch_1$ can be corrected according to equation (5). The numerical representation of the voltage of cell $B_1$, $\#VB_1$, can be calculated as a ratio of the cell voltage conversion output $NVB_{1,1}$ to the reference voltage conversion result $NVref_1$ multiplied by the numerical representation of the reference voltage value $\#Vref$. That is:

$$\#VB_1 \equiv \#Vref \cdot \frac{NVB_{1,1}}{NVref_1} = \#Vref \cdot \frac{Cs_1 \cdot VB_1 \cdot G_1}{C_{s1} \cdot Vref \cdot G_1} = \#Vref \cdot \frac{VB_1}{Vref} \quad (20)$$

The numerical representation of the voltage of cell $B_2$, $\#VB_2$, can be calculated using $\#VB_1$ as follows:

$$\#VB_2 \equiv \#VB_1 \cdot \frac{NVB_{2,2}}{NVB_{1,2}} =$$
$$\#Vref \cdot \frac{VB_1}{Vref} \cdot \frac{Cs_2 \cdot VB_2 \cdot G_2}{C_{s2} \cdot VB_1 \cdot G_2} = \#Vref \cdot \frac{VB_2}{Vref} \quad (21)$$

Similarly, the numerical representation of the voltage of cell $B_3$, $\#VB_3$, can be calculated using $\#VB_2$ as follows:

$$\#VB_3 \equiv \#VB_2 \cdot \frac{NVB_{3,3}}{NVB_{2,3}} =$$
$$\#Vref \cdot \frac{VB_2}{Vref} \cdot \frac{Cs_3 \cdot VB_3 \cdot G_3}{Cs_3 \cdot VB_2 \cdot G_3} = \#Vref \cdot \frac{VB_3}{Vref} \quad (22)$$

Generally, the numerical representation of the voltage of cell $B_k$, $\#VB_k$, can be calculated using $\#VB_{k-1}$ as follows:

$$\#VB_k \equiv \#VB_{k-1} \cdot \frac{NVB_{k,k}}{NVB_{(k-1),k}} = \#Vref \cdot \frac{VB_k}{Vref} \quad (23)$$

where k−1=0 corresponds to the reference voltage Vref 160.

The numerical representations calculated above may not be practically useful due to gain error. To improve practicality, gain correction factors can be used to correct the gain error in the default operation mode. The channels are configured in the default operation mode as described above (e.g., with reference to FIG. 2A) between calibrations, and their results of measurement are corrected using the gain correction factors. The cell voltages calculated above can be used after calibration procedure to obtain the cell voltages during the calibration procedure.

The gain correction factor for $Ch_1$, $Kg_1$, can be calculated using the results of the two-step calibration procedure as follows:

$$Kg_1 \equiv \frac{\#Vref}{NVref_1} = \frac{\#Vref}{Cs_1 \cdot G_1} \quad (24)$$

The gain correction factor for $Ch_2$, $Kg_2$, can be calculated using $Kg_1$ as follows:

$$Kg_2 \equiv Kg_1 \frac{NVB_{1,1}}{NVB_{1,2}} = \frac{\#Vref}{Cs_1 \cdot Vref \cdot G_1} \cdot \frac{Cs_1 \cdot VB_1 \cdot G_1}{Css_2 \cdot VB_1 \cdot G_2} = \frac{\#Vref}{C_{S2} \cdot G_2} \quad (25)$$

Similarly, the gain correction factor for $Ch_3$, $Kg_3$, can be calculated using $Kg_2$ as follows:

$$Kg_3 \equiv Kg_2 \frac{NVB_{2,2}}{NVB_{2,3}} = \frac{\#Vref}{Cs_2 \cdot Vref \cdot G_2} \cdot \frac{Cs_2 \cdot VB_2 \cdot G_2}{Cs_3 \cdot VB_2 \cdot G_3} = \frac{\#Vref}{Cs_3 \cdot G_3} \quad (26)$$

Similarly, the gain correction factor for $Ch_N$, $Kg_N$, can be calculated using $Kg_{N-1}$ as follows:

$$Kg_N \equiv Kg_{N-1} \frac{NVB_{(N-1),(N-1)}}{NVB_{(N-1),N}} = \quad (27)$$

$$\frac{\#Vref}{C_{sN-1} \cdot Vref \cdot G_{N-1}} \cdot \frac{Cs_{N-1} \cdot VB_{N-1} \cdot G_{N-1}}{Cs_N \cdot VB_{N-1} \cdot G_N} = \frac{\#Vref}{Cs_N \cdot G_N}$$

Generally, the gain correction factor for the k-th channel, $Kg_k$, can be calculated using the gain correction factor for the (k−1)-th channel, $Kg_{k-1}$, as follows:

$$Kg_k \equiv Kg_{k-1} \frac{NVB_{(k-1),(k-1)}}{NVB_{(k-1),k}} \quad (28)$$

where $Kg_0$ is defined as 1 by convention.

The voltage measurement for cell $B_1$ in the default operation mode, $\#VBx_1$, can be calculated using $Kg_1$ as follows:

$$\#VBx_1 \equiv Kg_1 \cdot NVBx_{1,1} = \frac{\#Vref}{Cs_1 \cdot G_1} \cdot Cs_1 \cdot VBx_1 \cdot G_1 = \#Vref \cdot \frac{VBx_1}{Vref} \quad (29)$$

The voltage measurement for cell $B_2$ in the default operation mode, $\#VBx_2$, can be calculated using $Kg_2$ as follows:

$$\#VBx_2 \equiv Kg_2 \cdot NVBx_{2,2} = \frac{\#Vref}{Cs_2 \cdot G_2} \cdot Cs_2 \cdot VBx_2 \cdot G_2 = \#Vref \cdot \frac{VBx_2}{Vref} \quad (30)$$

Similarly, the voltage measurement for cell $B_3$ in the default operation mode, $\#VBx_3$, can be calculated using $Kg_3$ as follows:

$$\#VBx_3 \equiv Kg_3 \cdot NVBx_{3,3} = \frac{\#Vref}{Cs_3 \cdot G_3} \cdot Cs_3 \cdot VBx_3 \cdot G_3 = \#Vref \cdot \frac{VBx_3}{Vref} \quad (31)$$

Similarly, the voltage measurement for cell $B_N$ in the default operation mode, $\#VBX_N$, can be calculated using $Kg_{N-1}$ as follows:

$$\#VBx_N \equiv Kg_{N-1} \cdot NVBx_{N,N} = \quad (32)$$

$$\frac{\#Vref}{Cs_N \cdot G_N} \cdot Cs_N \cdot VBx_N \cdot G_N = \#Vref \cdot \frac{VBx_N}{Vref}$$

Generally, the voltage measurement for cell $B_k$ in the default operation mode, $\#VBx_k$, can be calculated using $Kg_{k-1}$ as follows:

$$\#VBx_k \equiv Kg_{k-1} NVBx_{k,k} \quad (33)$$

Further details regarding the operations of the VMS 130 over time will be described in further detail below with reference to FIG. 4.

Figure 3:
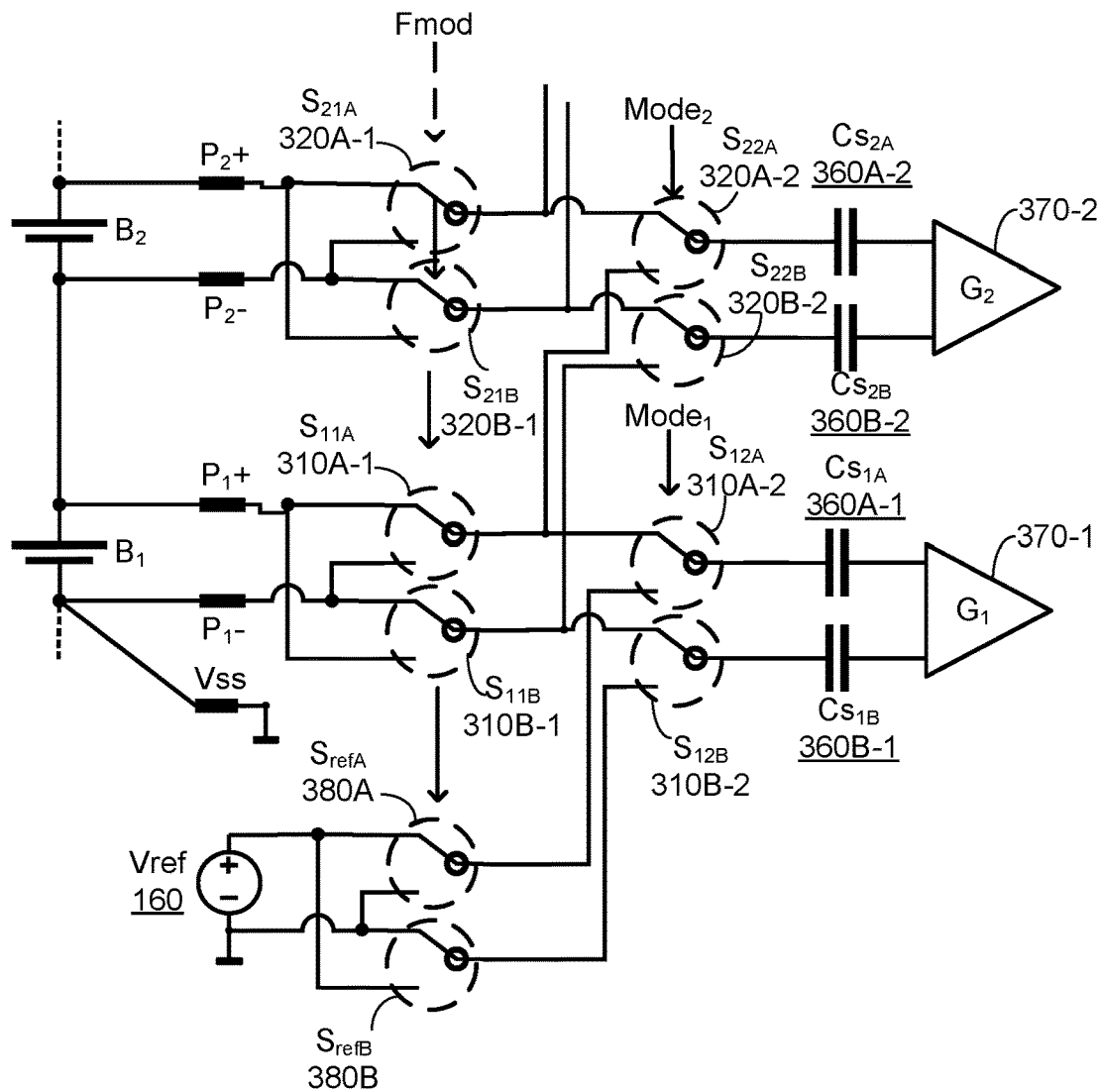
FIG. 3 is a schematic diagram of an example system including a differential channel voltage management system configured in a default mode, according to some embodiments.

FIG. 3 is a schematic diagram of an example system 300, according to some embodiments. The differential channel VMS can be used to implement the VMS 130 of FIGS. 1A-1B. The system 300 includes the set of cells $B_1$ through $B_N$, the set of pairs of pads (e.g., $P_k^+$ and $P_k^-$), the set of channels $Ch_1$ through $Ch_N$, and Vref 160, similar to the system 200 described above with reference to FIG. 2A.

In contrast to the system 200 described above with reference to FIG. 2A, each channel $Ch_k$ of the set of channels $Ch_1$ through $Ch_N$ is a differential channel including a pair of sampling switches, $S_{k1A}$ and $S_{k1B}$, and a pair of mode switches $S_{k2A}$ and $S_{k2}B$. For example, channel $Ch_1$ includes a pair of sampling switches $S_{11A}$ 310A-1 and $S_{11B}$ 310B-1, and a pair of mode switches $S_{12A}$ 310A-2 and $S_{11B}$ 310B-2. The channel $Ch_2$ includes a pair of sampling switches $S_{21A}$ 320A-1 and $S_{21B}$ 320B-1, and a pair of mode switches $S_{22A}$ 320A-2 and $S_{22B}$ 320B-2. Although only two channels are shown, the VMS can include any number of channels (e.g., N total channels).

Each channel $Ch_k$ of the set of channels $Ch_1$ through $Ch_N$ further includes a pair of sampling capacitors $Cs_{kA}$ and $Cs_{kB}$. For example, channel $Ch_1$ includes a pair of sampling capacitors $Cs_{1A}$ 360A-1 and $Cs_{1B}$ 360B-1, and channel $Ch_2$ includes a pair of sampling capacitors $Cs_{2A}$ 360A-2 and $Cs_{2B}$ 360B-2.

Each channel $Ch_k$ of the set of channels $Ch_1$ through $Ch_N$ further includes a charge-to-code converter ("converter"). For example, channel $Ch_1$ includes a converter 270-1, channel $Ch_2$ includes a converter 270-2, channel $Ch_3$ includes a converter 270-3, channel $Ch_4$ includes a converter 270-4, . . . , and channel $Ch_N$ includes a converter 270-5. Each converter 270-1 through 270-5 has a respective conversion ratio $G_1$ through $G_N$. In some embodiments, each converter 270-1 through 270-5 is based on a ΣΔ, and the conversion ratio of the k-th channel, $G_k$, =G+$\Delta_k$ where G is a conversion factor (e.g., rated value of the conversion factor) and $\Delta_k$ is an error of the conversion factor for the k-th channel.

The system 200 further includes a pair of reference voltage switches $S_{refA}$ 280A and $S_{refB}$ 280B that can selectively connect to a positive terminal of Vref 160 or a negative terminal of Vref 160. The reference voltage measurement of cell $B_k$, $Nref_k$, can be determined as follows: $C_k \cdot Vref \cdot G_k$, where Vref is the reference voltage output by $V_{ref}$ 160.

Each pair of sampling switches $S_{k1A}$ and $S_{k1B}$ can selectively connect to $P_k^+$ or $P_k^-$. The position of each pair of sampling switches $S_{k1A}$ and $S_{k1B}$ can be controlled via a frequency signal "Fmod". More specifically, Fmod can periodically cause one or more of the sampling capacitors $Cs_1$ through $CS_N$ 260-1 through 260-N to be connected to one or more of the respective cells $B_1$ through $B_N$ by controlling the position of one or more respective sampling switches 210-1 through 250-1.

Each pair of mode switches $S_{k2}A$ and $S_{k2}B$ can selectively connect to an output of the pair of sampling switches $S_{k1A}$ and $S_{k1B}$, an output of the pair of sampling switches $S_{(k-1)A}$ and $S_{(k-1)B}$, or an output of the pair of reference voltage switches $S_{refA}$ 280A and $S_{refB}$ 280B (e.g., in the case of the pair of mode switches $S_{12}$ 310A-2 and $S_{12}$ 310B-2). The position of each pair of mode switches $S_{k2}A$ and $S_{k2}B$ can be controlled by a respective mode signal (e.g., "Mode$_1$" and "Mode$_2$"). For example, the position of each of the mode switches can reflect operation in a default mode, or a calibration mode.

The system 300 shown in FIG. 3 is configured in a default mode. More specifically, each pair of sampling switches $S_{k1A}$ and $S_{k1B}$ is in a neutral position. Additionally, the mode switches of each pair of mode switches $S_{k2}A$ and $S_{k2}B$ are in an up position to connect to an output of respective ones of the pair of sampling switches $S_{k1A}$ and $S_{k1B}$. The pair of reference voltage switches $S_{refA}$ 380A and $S_{refB}$ 380B are in a neutral mode.

The system of FIG. 3 can also be configured to operate in a calibration mode. For example, similar reference to FIGS. 2B-2C, the positions of the mode switches of each pair of mode switches $S_{k2}A$ and $S_{k2}B$ can be adjusted to configure the system 300 to be in a first step of a two-step calibration procedure or a second step of the two-step calibration procedure, respectively.

Figure 4:
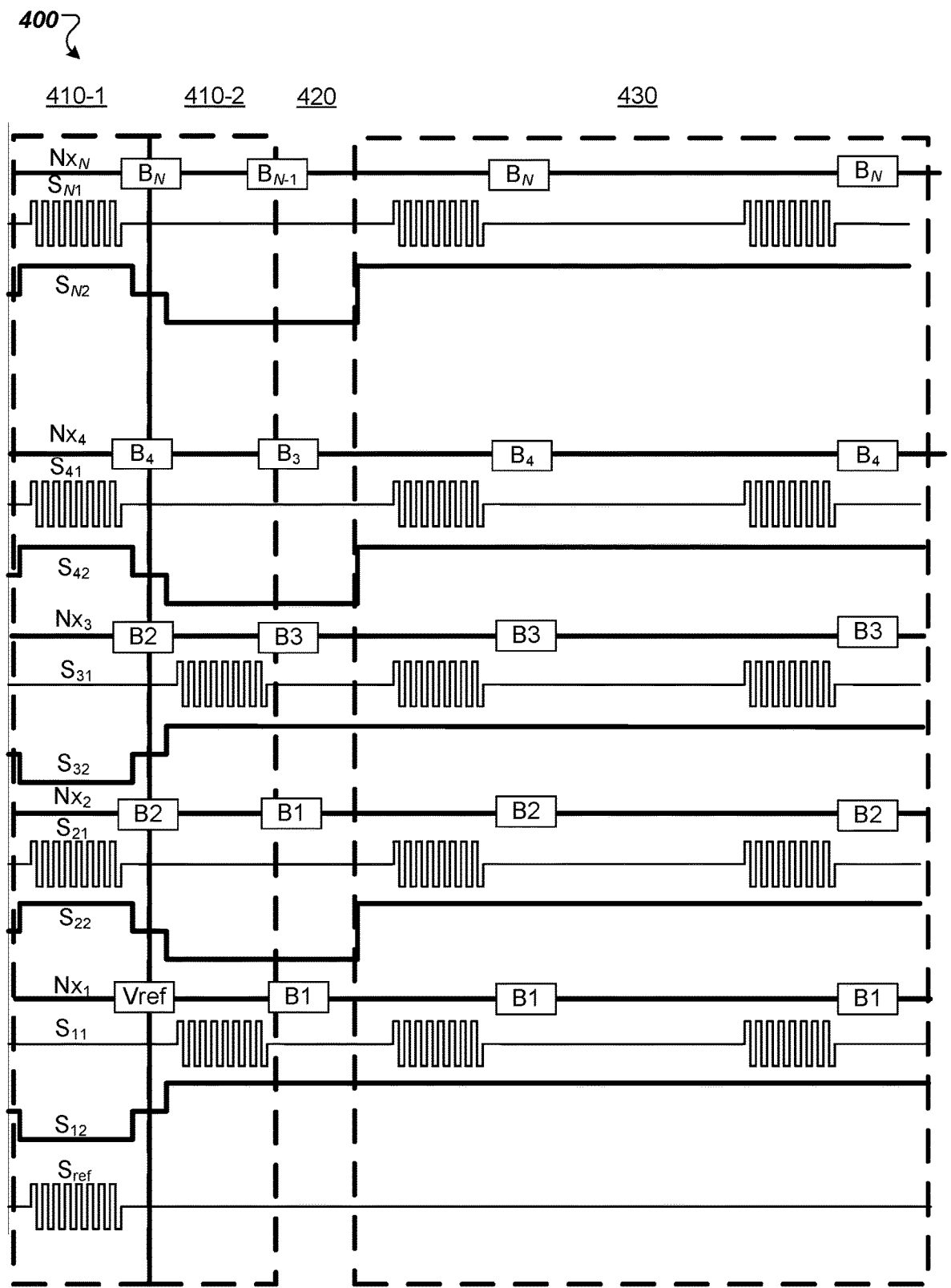
FIG. 4 is a diagram illustrating an example operation of a system including a battery management system, according to some embodiments.

FIG. 4 is a diagram 400 illustrating an example operation of a BMS including VMS, according to some embodiments. More specifically, the diagram 400 assumes that the VMS is a single-end channel VMS (e.g., the VMS described above with reference to FIGS. 2A-2C). For example, it is assumed that the VMS includes, for each channel Ch$_k$, a respective sampling switch $S_{k1}$ and a respective mode switch $S_{k2}$ (where k∈[1, N]). It is assumed that N is even, as described above with reference to FIG. 2A. The diagram 400 further shows channel data Nx$_k$ for each channel Ch$_k$. However, a similar diagram can be created for a differential channel VSM (e.g., the VMS described above with reference to FIG. 3).

As shown, the operation of the BMS includes a first step of a calibration procedure 410-1, a second step of the calibration procedure 410-2, a gain correction factors calculation operation 420, and a default operation 430 using the gain correction factors calculated during the gain correction factors calculation operation 420.

During operation 410-1, the mode switches of odd channels (e.g., $S_{12}$ and $S_{32}$) are in a down position and the mode switches of even channels (e.g., $S_{22}$, $S_{42}$ and $S_{N2}$) are in an up position. The sampling switches of the even channels are periodically switching in accordance with the frequency Fmod. Channel data for Vref and the even cells (e.g., B$_2$, B$_4$ and B$_N$) are obtained during operation 410-1.

During operation 420-1, the mode switches of the odd channels are placed in the up position and the mode switches of the even channels are placed in the down position. The sampling switches of the odd channels are periodically switching in accordance with the frequency Fmod. Channel data for Vref and the odds cells (e.g., B$_2$, B$_3$ and B$_{N-1}$) are obtained during operation 410-2.

During operation 430, gain correction factors are calculated using the results of operations 410-1 and 410-2. For example, as described above with reference to FIG. 2C, the gain correction factor for each Ch$_k$, Kg$_k$, can be determined based on the gain correction factor Kg$_{k-1}$ for Ch$_{k-1}$, the value of the voltage of cell B$_{k-1}$, NVB$_{(k-1),(k-1)}$, and the value of the voltage of cell B$_k$, NVB$_{k,k}$ (e.g., equation (28)).

During operation 440, all of the mode switches are placed in the up position. All of the sampling switches are periodically switching in accordance with the frequency Fmod. Channel data for each of the cells B$_1$ through B$_N$ is obtained during operation 430. More specifically, during operation 440, conversion results for each channel are obtained periodically by the respective sampling switches. A conversion result for each Ch$_k$ is multiplied by the respective conversion factor determined for Ch$_k$ (i.e., Kg$_k$) to obtain a voltage measurement for the cell B$_k$ (e.g., equation (33)). The voltage measurements can be reported to the BMS for performing one or more battery management operations, such as cell balancing. The calibration procedure can be repeated periodically or if the operation conditions change significantly.

Figure 5:
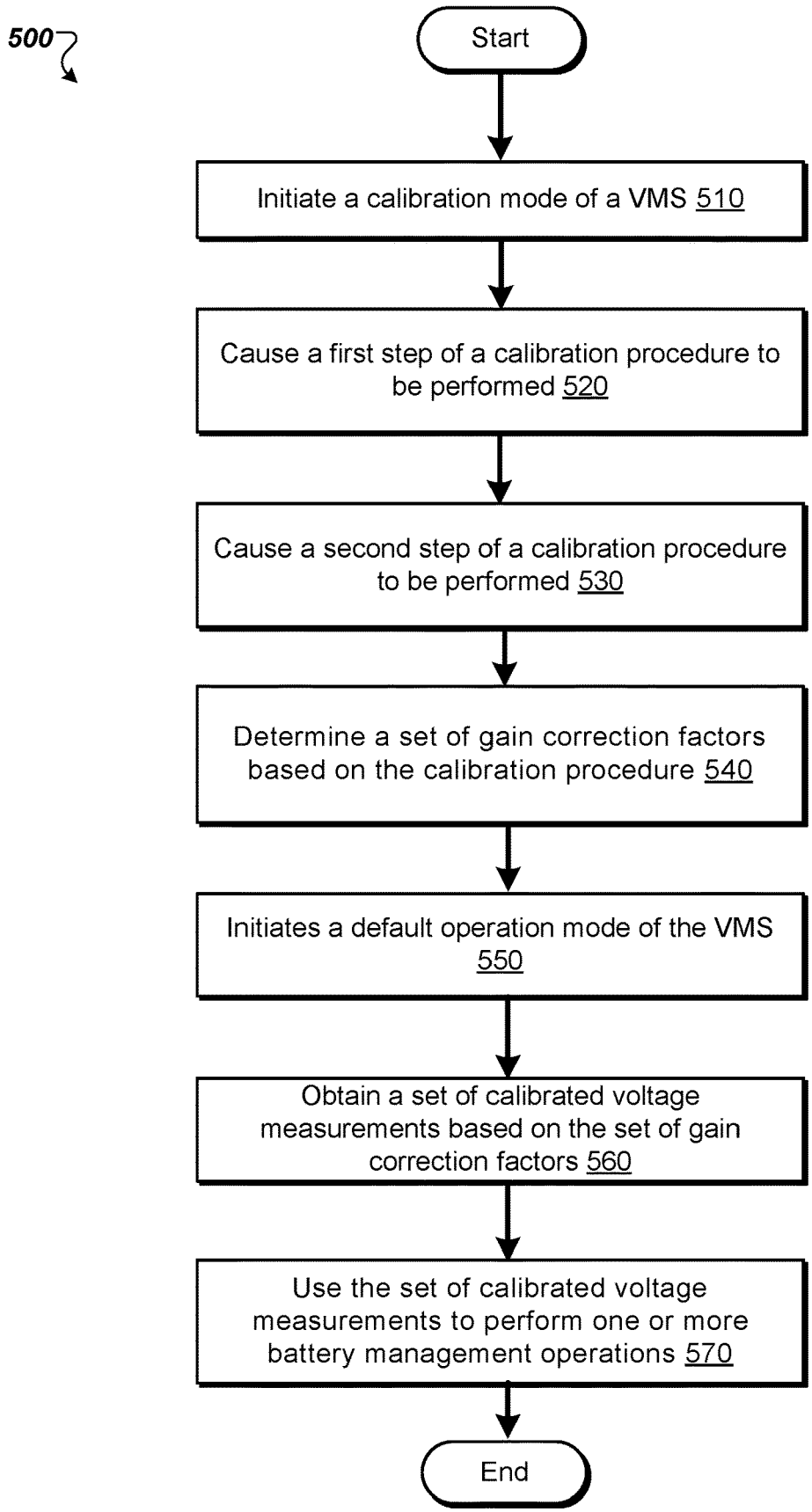
FIG. 5 is a flow diagram of method of implementing voltage measurement calibration for battery management systems, according to some embodiments.

FIG. 5 is a flowchart of a method 500 of implementing voltage measurement calibration for battery management systems, according to some embodiments. The method 500 may be performed by processing logic that comprises hardware (e.g., circuitry, dedicated logic, programmable logic, microcode, etc.), software, firmware, or a combination thereof. In some embodiments, the method 500 may be performed by any of the processing devices described herein. In some embodiments, the method 500 is performed by one or more components of the BMS 120 of FIGS. 1-3 (e.g., the VMS 130).

At operation 510, processing logic initiates a calibration mode of a voltage management subsystem (VMS). For example, initiating the calibration mode can include terminating a default operation mode of the VMS. The VMS can include a plurality of channels. Each channel of the plurality of channels can be connected to a respective cell of a battery pack. Each channel and respective cell can have an index number. The plurality of channels can include a first set of channels and a second set of channels. For example, the first set of channels can include each channel of the plurality of channels having an odd index number (i.e., each odd channel) and each channel of the plurality of channels having an even index number (i.e., each even channel).

Each channel of the plurality of channels can include at least one reference voltage switch coupled to a reference voltage source, at least one sampling switch that can selectively connect to a positive pad or a negative pad, and at least one mode switch connected to at least one sampling capacitor and that can selectively connect to one of: the at least one sampling switch of the channel, the at least one sampling switch of an adjacent channel having a lower index number, or the at least one reference voltage switch (e.g., in the case of the first channel of the plurality of channels having index number 1). Each channel can further include a charge-to-code converter ("converter") coupled to an output of the at least one sampling capacitor.

In some embodiments, the plurality of channels includes a plurality of single end channels. For example, the at least one reference voltage switch can include a single reference voltage switch, the at least one sampling switch can include a single sampling switch, the at least one mode switch can include a single mode switch, and the at least one sampling capacitor can include a single sampling capacitor.

In some embodiments, the plurality of channels includes a plurality of differential channels. For example, the at least one reference voltage switch can include a pair of reference voltage switches, the at least one sampling switch can include a pair of sampling switches, the at least one mode switch can include a pair of mode switches, and the at least one sampling capacitor can include a pair of sampling capacitors.

At operation 520, processing logic causes a first step of a calibration procedure to be performed. For example, causing the first step of the calibration procedure to be performed can include causing each mode switch of a first set of mode switches to be placed in a first position, and causing each mode switch of a second set of mode switches to be placed in a second position opposite the first position. In some embodiments, the first set of mode switches includes the switches of the odd channels and the second set of mode switches includes the switches of the even channels. In some embodiments, the first position is the down position, and the second position is the up position. Performing the first step of the calibration procedure can further include obtaining a first set of voltage measurements of the calibration procedure. Each voltage measurement of the first set of voltage measurements is obtained by a respective channel of the plurality of channels. More specifically, each voltage measurement can be determined based on a base voltage measurement, the capacitance of the at least one sampling capacitor of the channel, and a conversion factor for the channel.

For example, if the first set of mode switches includes the switches of the odd channels and the first position is the down position, then the channel having an index number 1 (i.e., $Ch_1$) can be configured to obtain a voltage measurement from a reference voltage source, and adjacent channels having index numbers k and k+1 (i.e., $Ch_k$ and $Ch_{k+1}$) can each be configured to obtain a respective voltage measurement from cell k, where k>1. The voltage measurement for $Ch_1$ can be determined based on a base voltage measurement of the voltage reference source, the capacitance of the at least one sampling capacitor of $Ch_1$, and the conversion factor for $Ch_1$. The voltage measurement for each $Ch_k$ where k>1 can be determined based on a base voltage measurement of cell $B_k$, the capacitance of the at least one sampling capacitor of $Ch_k$, and the conversion factor for $Ch_k$. The voltage measurement for each $Ch_{k+1}$ where k>1 can be determined based on a base voltage measurement of cell $B_k$, the capacitance of the at least one sampling capacitor of $Ch_{k+1}$, and the conversion factor for $Ch_{k+1}$.

At operation 530, processing logic causes a second step of a calibration procedure to be performed. For example, causing the second step of the calibration procedure to be performed can include causing each mode switch of the first set of mode switches to be placed in the second position, and causing each mode switch of the second set of mode switches to be placed in the first position. Performing the second step of the calibration procedure can further include obtaining a second set of voltage measurements of the calibration procedure. Each voltage measurement of the second set of voltage measurements is obtained by a respective channel of the plurality of channels. More specifically, each voltage measurement can be determined based on a base voltage measurement, the capacitance of the at least one sampling capacitor of the channel, and the conversion factor for the channel.

For example, if the first set of mode switches includes the switches of the odd channels and the second position is the up position, then adjacent channels having index numbers k and k+1 (i.e., $Ch_k$ and $Ch_{k+1}$) can each be configured to obtain a respective voltage measurement from cell k. The voltage measurement for each $Ch_k$ can be determined based on a base voltage measurement of cell $B_k$, the capacitance of the at least one sampling capacitor of $Ch_k$, and the conversion factor for $Ch_k$. The voltage measurement for each $Ch_{k+1}$ can be determined based on a base voltage measurement of cell $B_k$, the capacitance of the at least one sampling capacitor of $Ch_{k+1}$, and the conversion factor for $Ch_{k+1}$.

At operation 540, processing logic determines a set of gain correction factors based on the calibration procedure. Each gain correction factor corresponds to a respective channel of the plurality of channels. More specifically, the set of gain correction factors can be determined based on the first set of voltage measurements and the second set of voltage measurements. For example, the gain correction factor for $Ch_k$ can be recursively determined based on the gain correction factor for $Ch_{k-1}$ and a ratio of the voltage measurement value of cell $B_{k-1}$ as measured by $Ch_{k-1}$ and the voltage measurement value of cell $B_{k-1}$ as measured by $Ch_k$. More specifically, the gain correction factor for $Ch_k$ can be determined as a ratio of the numerical reference voltage measurement to a product of the capacitance of the sampling capacitor of $Ch_k$ and the conversion factor for $Ch_k$.

At operation 550, processing logic initiates a default operation mode of the VMS. For example, processing logic can cause the at least one mode switch of each channel to be connected to the at least one sampling switch of the channel (e.g., place each mode switch in an up position).

At operation 560, processing logic obtains a set of calibrated voltage measurements based on the set of gain correction factors. More specifically, the set of calibrated voltage measurements can be a set of voltage measurements obtained during the default operation mode. Each calibrated voltage measurement of the set of calibrated voltage measurements is determined for a cell connected to a respective channel. For example, the set of calibrated voltage measurements for cell $B_k$ connected to channel $Ch_k$ can be determined as the voltage measurement of cell $B_k$ multiplied by the gain correction factor determined for the channel $Ch_{k-1}$.

At operation 570, processing logic uses the set of calibrated voltage measurements to perform one or more battery management operations. For example, the one or more battery management operations can include cell balancing. Further details regarding operations 510-570 are described above with reference to FIGS. 1-4.

In the above description, some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "initiating", "causing," "determining," "obtaining," "using," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "some embodiments" or "an embodiment" or "some embodiments" throughout is not intended to mean the same embodiment or embodiment unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The methods and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details, such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A system comprising:
a battery pack comprising a plurality of cells; and
a battery management system coupled to the battery pack, the battery management system comprising:
    a plurality of channels, each channel of the plurality of channels being connected to a respective cell of the plurality of cells, wherein the plurality of channels comprises a first set of channels and a second set of channels, and wherein each channel of the plurality of channel comprises at least one mode switch that selectively connects to one of: at least one sampling switch of the channel, at least one sampling switch of an adjacent channel, or a reference voltage switch; and
    a processing unit, operatively coupled to the battery management system, configured to:
        cause a first step of a calibration procedure to be performed to obtain a first set of voltage measurements by causing each mode switch of a first set of mode switches to be placed in a first position and each mode switch of a second set of mode switches to be placed in a second position, wherein each mode switch of the first set of mode switches is comprised within a channel of the first set of channels, and wherein each mode switch of the second set of mode switches is comprised within a channel of the second set of channels; and
        cause a second step of the calibration procedure to be performed to obtain a second set of voltage measurements by causing each mode switch of the first set of mode switches to be placed in the second position and each mode switch of the second set of mode switches to be placed in the first position, wherein each voltage measurement of the first set of voltage measurements and the second set of voltage measurements corresponds to a respective channel of the plurality of channels.

2. The system of claim 1, wherein the first set of channels comprises each odd channel of the plurality of channels, and wherein the second set of channel comprises each even channel of the plurality of channels.

3. The system of claim 1, wherein:
the battery management system further comprises a reference voltage source connected to the reference voltage switch.

4. The system of claim 1, wherein:
during the first step of the calibration procedure, the first set of channels comprises a first odd channel having the at least one mode switch connected to the reference voltage switch, and a second odd channel having the at least one mode switch connected to at least one sampling switch of an even channel adjacent to the second odd channel; and
during the first step of the calibration procedure, the second set of channels comprises an even channel having the at least one mode switch connected to the at least one sampling switch of the even channel.

5. The system of claim 1, wherein:
during the second step of the calibration procedure, the first set of channels comprises an odd channel having the at least one mode switch connected to at least one sampling switch of the odd channel; and
during the second step of the calibration procedure, the second set of channels comprises an even channel having the at least one mode switch connected to at least one sampling switch of an odd channel adjacent to the even channel.

6. The system of claim 1, wherein the processing unit is further configured to determine a set of gain correction factors based on the first set of voltage measurements and the second set of voltage measurements, and wherein each gain correction factor corresponds to a respective channel of the plurality of channels.

7. The system of claim 6, wherein:
each channel of the plurality of channels further comprises at least one sampling capacitor connected to the at least one mode switch, and a charge-to-code converter connected to the at least one sampling capacitor;
each voltage measurement of the first set of voltage measurements and the second set of voltage measurements is determined based on a base voltage measurement of a respective cell of the plurality of cells, a capacitance of the at least one sampling capacitor of the channel, and a conversion factor associated with the charge-to-code converter of the channel; and
each gain correction factor of the set of gain correction factors is determined based on a numerical reference voltage measurement, the capacitance of the at least one sampling capacitor of the channel, and the conversion factor associated with the charge-to-code converter of the channel.

8. The system of claim 6, wherein the processing unit is further configured to:
initiate a default operation mode of the plurality of channels;
obtain a set of calibrated voltage measurements based on the set of gain correction factors; and
use the set of calibrated voltage measurements to perform one or more battery management operations.

9. A system comprising:
a processing unit to:
cause a first step of a calibration procedure to be performed to obtain a first set of voltage measurements by causing each mode switch of a first set of mode switches to be placed in a first position and each mode switch of a second set of mode switches to be placed in a second position, wherein each mode switch of the first set of mode switches is comprised within a channel of a first set of channels of a plurality of channels, wherein each mode switch of the second set of mode switches is comprised within a channel of a second set of channels of the plurality of channels, and wherein each mode switch of a channel selectively connects to one of: at least one sampling switch of the channel, at least one sampling switch of an adjacent channel, or a reference voltage switch; and
cause a second step of the calibration procedure to be performed to obtain a second set of voltage measurements by causing each mode switch of the first set of mode switches to be placed in the second position and each mode switch of the second set of mode switches to be placed in the first position, wherein each voltage measurement of the first set of voltage measurements and the second set of voltage measurements corresponds to a respective cell of a plurality of cells of a battery pack.

10. The system of claim 9, wherein:
during the first step of the calibration procedure, the first set of channels comprises a first odd channel having at least one mode switch connected to the reference voltage switch, and a second odd channel having at least one mode switch connected to at least one sampling switch of an even channel adjacent to the second odd channel; and
during the first step of the calibration procedure, the second set of channels comprises an even channel having at least one mode switch connected to at least one sampling switch of the even channel.

11. The system of claim 9, wherein:
during the second step of the calibration procedure, the first set of channels comprises an odd channel having at least one mode switch connected to at least one sampling switch of the odd channel; and
during the second step of the calibration procedure, the second set of channels comprises an even channel having at least one mode switch connected to at least one sampling switch of an odd channel adjacent to the even channel.

12. The system of claim 9, wherein the processing unit is further configured to determine a set of gain correction factors based on the first set of voltage measurements and the second set of voltage measurements, and wherein each gain correction factor corresponds to a respective channel of the plurality of channels.

13. The system of claim 12, wherein:
each channel of the plurality of channels further comprises at least one sampling capacitor connected to the at least one mode switch, and a charge-to-code converter connected to the at least one sampling capacitor;
each voltage measurement of the first set of voltage measurements and the second set of voltage measurements is determined based on a base voltage measurement of a respective cell of the plurality of cells, a capacitance of the at least one sampling capacitor of the channel, and a conversion factor associated with the charge-to-code converter of the channel; and
each gain correction factor of the set of gain correction factors is determined based on a numerical reference voltage measurement, the capacitance of the at least one sampling capacitor of the channel, and the conversion factor associated with the charge-to-code converter of the channel.

14. The system of claim 12, wherein the processing unit is further configured to:
initiate a default operation mode;
obtain a set of calibrated voltage measurements based on the set of gain correction factors; and
use the set of calibrated voltage measurements to perform one or more battery management operations.

15. A method comprising:
causing, by a processing unit, a first step of a calibration procedure to be performed to obtain a first set of voltage measurements by causing each mode switch of a first set of mode switches to be placed in a first position and each mode switch of a second set of mode switches to be placed in a second position, wherein each mode switch of the first set of mode switches is comprised within a channel of a first set of channels of a plurality of channels, wherein each mode switch of the second set of mode switches is comprised within a channel of a second set of channels of the plurality of channels, and wherein each mode switch of a channel selectively connects to one of: at least one sampling switch of the channel, at least one sampling switch of an adjacent channel, or a reference voltage switch; and
causing, by the processing unit, a second step of the calibration procedure to be performed to obtain a second set of voltage measurements by causing each mode switch of the first set of mode switches to be placed in the second position and each mode switch of the second set of mode switches to be placed in the first position, wherein each voltage measurement of the first set of voltage measurements and the second set of voltage measurements corresponds to a respective cell of a plurality of cells of a battery pack.

16. The method of claim 15, wherein:
during the first step of the calibration procedure, the first set of channels comprises a first odd channel having at least one mode switch connected to the reference voltage switch, and a second odd channel having at least one mode switch connected to at least one sampling switch of an adjacent even channel; and
during the first step of the calibration procedure, the second set of channels comprises an even channel having at least one mode switch connected to at least one sampling switch of the even channel.

17. The method of claim 15, wherein:
during the second step of the calibration procedure, the first set of channels comprises an odd channel having at least one mode switch connected to at least one sampling switch of the odd channel; and
during the second step of the calibration procedure, the second set of channels comprises an even channel having at least one mode switch connected to at least one sampling switch of an adjacent odd channel.

18. The method of claim 15, further comprising determining, by the processing unit, a set of gain correction factors based on the first set of voltage measurements and the second set of voltage measurements, and wherein each gain correction factor corresponds to a respective channel of the plurality of channels.

19. The method of claim 18, wherein:
each channel of the plurality of channels further comprises at least one sampling capacitor connected to the at least one mode switch, and a charge-to-code converter connected to the at least one sampling capacitor;
each voltage measurement of the first set of voltage measurements and the second set of voltage measurements is determined based on a base voltage measurement of a respective cell of the plurality of cells, a capacitance of the at least one sampling capacitor of the channel, and a conversion factor associated with the charge-to-code converter of the channel; and
each gain correction factor of the set of gain correction factors is determined based on a numerical reference voltage measurement, the capacitance of the at least one sampling capacitor of the channel, and the conversion factor associated with the charge-to-code converter of the channel.

20. The method of claim 18, further comprising:
initiating, by the processing unit, a default operation mode;
obtaining, by the processing unit, a set of calibrated voltage measurements based on the set of gain correction factors; and
using, by the processing unit, the set of calibrated voltage measurements to perform one or more battery management operations.

* * * * *